United States Patent
Liu et al.

(10) Patent No.: US 11,651,924 B1
(45) Date of Patent: May 16, 2023

(54) METHOD OF PRODUCING MICRORODS FOR ELECTRON EMITTERS, AND ASSOCIATED MICRORODS AND ELECTRON EMITTERS

(71) Applicant: FEI Company, Hillsboro, OR (US)

(72) Inventors: Kun Liu, Portland, OR (US); Chad Rue, North Plains, OR (US); Alan Stephen Bahm, Hillsboro, OR (US)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 17/846,498

(22) Filed: Jun. 22, 2022

(51) Int. Cl.
*H01J 37/073* (2006.01)
*H01J 1/304* (2006.01)
*H01J 1/34* (2006.01)
*H01J 19/24* (2006.01)

(52) U.S. Cl.
CPC .............. *H01J 1/3044* (2013.01); *H01J 1/34* (2013.01); *H01J 19/24* (2013.01); *H01J 37/073* (2013.01); *H01J 2201/30415* (2013.01); *H01J 2201/30449* (2013.01); *H01J 2237/06341* (2013.01)

(58) Field of Classification Search
CPC .................................................... H01J 37/073
See application file for complete search history.

(56) References Cited

U.S. PATENT DOCUMENTS

| | | |
|---|---|---|
| 2011/0101238 A1 | 5/2011 | Tessner, II et al. |
| 2018/0005791 A1 | 1/2018 | Schultz et al. |

FOREIGN PATENT DOCUMENTS

| | | |
|---|---|---|
| JP | 4888128 B2 | 7/2008 |
| WO | WO 2016/167048 A1 | 8/2016 |
| WO | WO 2021/130837 | 7/2021 |

OTHER PUBLICATIONS

Tang et al; "A controllable and efficient method for the fabrication of a single HfC nanowire field-emission point electron source aided by low keV FIB milling"; Royal Society of Chemistry; Nanoscale, 2020, vol. 12, pp. 16770-16774.

Zhang et al; "An ultrabright and monochromatic electron point source made of a LaB6 nanowire"; 1National Institute for Materials Science; Nature Nanotechnology | Advance Online Publication | www.nature.com/naturenanotechnology; 2015; 8 pages.

*Primary Examiner* — Joseph L Williams
(74) *Attorney, Agent, or Firm* — Klarquist Sparkman, LLP

(57) ABSTRACT

Methods of producing microrods for electron emitters and associated microrods and electron emitters. In one example, a method of producing a microrod for an electron emitter comprises providing a bulk crystal ingot, removing a first plate from the bulk crystal ingot, reducing a thickness of the first plate to produce a second plate, and milling the second plate to produce one or more microrods. In another example, a microrod for an electron emitter comprises a microrod tip region that comprises a nanoneedle that in turn comprises a nanorod and a nanoprotrusion tip. The microrod and the nanoneedle are integrally formed from a bulk crystal ingot by sequentially: (i) removing the microrod from the bulk crystal ingot; (ii) coarse processing the microrod tip region to produce the nanorod; and (iii) fine processing the nanorod to produce the nanoprotrusion tip.

20 Claims, 7 Drawing Sheets

METHOD OF PRODUCING MICRORODS FOR ELECTRON EMITTERS, AND ASSOCIATED MICRORODS AND ELECTRON EMITTERS

FIELD

The present disclosure relates to methods of producing microrods for electron emitters, and more specifically to methods for producing lanthanum hexaboride ($LaB_6$) microrods with well-defined crystal properties.

BACKGROUND

Cold field electron emitters are used in a wide variety of applications that harness electron beams, such as high-resolution microscopy, displays, sensors, and others. Preferred properties of such electron emitters include a high melting point, a low material work function, and the ability to produce a stable emission current over a large period of time (e.g., several hours). Tungsten traditionally has been used to form such electron emitters, despite its relatively high material work function of 4.5 eV, the relatively low temporal stability of the emission current produced by tungsten emitters, and the necessity to operate such emitters under ultrahigh vacuum (UHV) conditions.

Recently, new research has demonstrated that lanthanum hexaboride ($LaB_6$) may serve as an attractive alternative to tungsten, with a relatively low work function of 2.07 eV and an emitted current stability that persists for tens of hours. Preparing a $LaB_6$ electron emitter presents certain practical challenges, however. For example, some existing techniques for producing a $LaB_6$ emitter include growing a large number of $LaB_6$ nanowires on a crystal substrate, selecting one such nanowire from this "haystack," and precisely positioning the nanowire on the end of an emitter. Additionally, such existing techniques necessitate that several steps be performed in UHV conditions, and these techniques generally require high processing times and result in low product yields. In addition to the practical challenges of manipulating such a nanowire, such a method fails to ensure that any given nanowire selected from the haystack will exhibit the desired crystal orientation for optimal functionality as an electron emitter.

SUMMARY

Methods of producing microrods for electron emitters and associated microrods and electron emitters are disclosed herein. In a representative example, a method of producing a microrod for an electron emitter comprises providing a bulk crystal ingot that extends along a crystal orientation axis, producing a first plate from a working portion of the bulk crystal ingot, producing a second plate from the first plate, and producing one or more microrods from the second plate. The producing the first plate comprises machining the working portion to remove the first plate from the bulk crystal ingot. The producing the second plate comprises reducing a thickness of the first plate. The producing the one or more microrods comprises milling the second plate to remove material from the second plate and to at least partially define the one or more microrods.

In another representative example, a microrod for an electron emitter comprises a microrod tip region that comprises a nanoneedle that in turn comprises a nanorod and a nanoprotrusion tip. The microrod and the nanoneedle are integrally formed from a bulk crystal ingot by sequentially: (i) removing the microrod from the bulk crystal ingot; (ii) coarse processing the microrod tip region to produce the nanorod; and (iii) fine processing the nanorod to produce the nanoprotrusion tip. The removing the microrod from the bulk crystal ingot comprises producing a first plate from a working portion of the bulk crystal ingot; producing a second plate from the first plate; and producing one or more microrods from the second plate by milling the second plate to remove material from the second plate and to at least partially define the one or more microrods The foregoing and other objects, features, and advantages of the present disclosure will become more apparent from the following detailed description, which proceeds with reference to the accompanying figures.

DETAILED DESCRIPTION

The present disclosure relates to methods of producing a microrod for an electron emitter. In particular, the electron emitter includes a microrod that terminates in a nanoneedle and that extends along a well-defined crystal orientation. The methods use a top-down approach that produces one or more microrods from a bulk crystal with a well-defined crystal orientation. In some examples, each microrod further may be processed to define a nanoneedle with a nanoprotrusion tip at a terminal end thereof. The methods disclosed herein may be particularly suitable for forming an electron emitter from a material such as lanthanum hexaboride ($LaB_6$).

Figure 1:
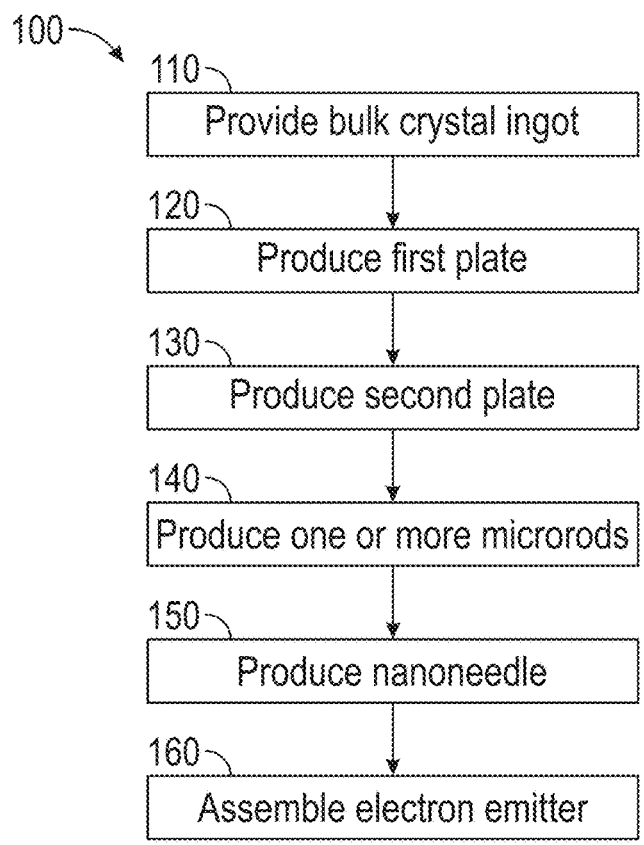
FIG. 1 is a high-level flow chart illustrating an example method for producing a microrod for an electron emitter according to an example.

FIG. 1 is a high-level flowchart depicting an example of a method 100 of producing a microrod for an electron emitter, while FIGS. 2-11 represent a sequence of steps corresponding to such a method. In FIGS. 2-11, elements that serve a similar, or at least substantially similar, purpose are labeled with like numbers (e.g., identical numbers when omitting the first digit), and these elements may not be discussed in detail herein with reference to each of FIGS. 2-11. Similarly, all elements may not be labeled in each of FIGS. 2-11, but reference numbers associated therewith may be utilized herein for consistency. Elements, components, and/or features that are discussed herein with reference to one or more of FIGS. 2-11 may be included in and/or utilized with any of FIGS. 2-11 without departing from the scope of the present disclosure.

In the present disclosure, various steps of the method 100 are described alongside discussions of the structures illustrated in FIGS. 2-11. Accordingly, it is to be understood that the various steps of the method 100 may be described as steps for producing the structures illustrated in FIGS. 2-11, and/or that the structures of FIGS. 2-11 may be described as examples of structures used and/or formed in the process of performing the method 100. In this manner, a description of a property (e.g., a dimension) of a structure that is illustrated in any of FIGS. 2-11 equivalently may be understood as disclosing the step of producing such a structure in the context of the method 100. This is not required, however, and it also is within the scope of the present disclosure that the method 100 may be performed without producing the specific structures illustrated in FIGS. 2-11.

Figure 2:
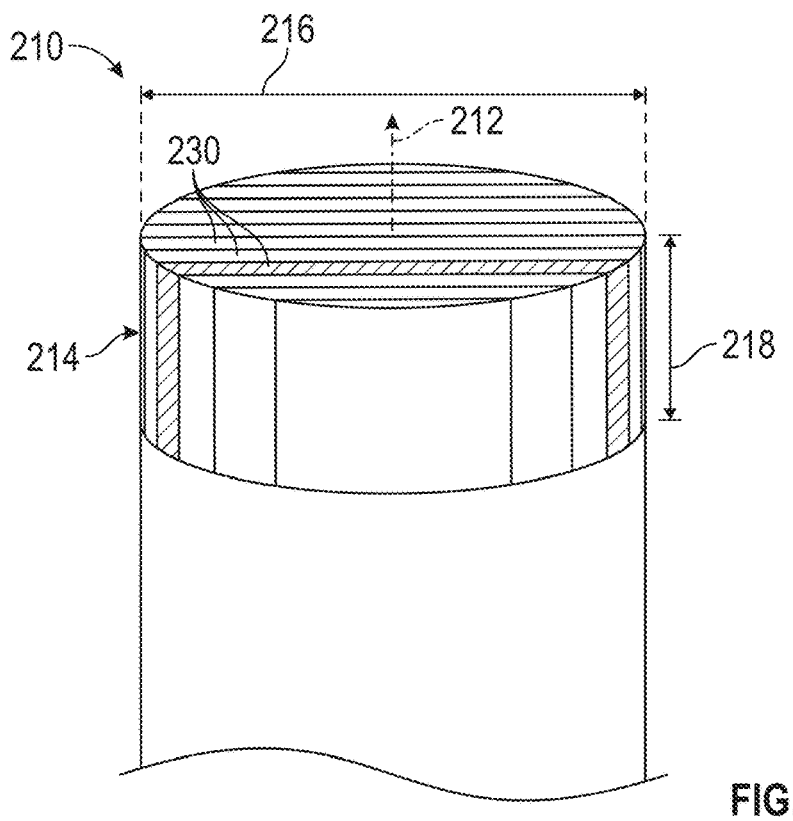
FIG. 2 illustrates a bulk crystal ingot with a working portion according to an example.

As shown in FIG. 1, the method 100 includes providing, at 110, a bulk crystal ingot that extends along a crystal orientation axis. FIG. 2 illustrates an example of a bulk crystal ingot 210 that may be provided in such a step. In the example of FIG. 2, the bulk crystal ingot 210 extends along a crystal orientation axis 212. In particular, the present disclosure generally relates to examples in which the bulk crystal ingot 210 is a purified lanthanum hexaboride ($LaB_6$) rod and in which the crystal orientation axis 212 is a direction selected from the <100> family of crystal directions. That is, because $LaB_6$ exhibits a simple cubic crystalline structure, when the crystal orientation axis 212 extends along a direction perpendicular to a face of the cubic structure, the crystal orientation axis 212 equivalently may be referred to as any of the [100] direction, the [010] direction, or the [001] direction.

The providing the bulk crystal ingot at 110 may be performed in any suitable manner, such as by obtaining or forming a bulk crystal ingot that exhibits a substantially pure crystal structure with a well-defined crystal orientation. For example, the producing the bulk crystal ingot at 110 may include forming the bulk crystal ingot via a zone-melting recrystallization method. As is known in the art, such a method (also known as a zone-refining method) generally includes heating a localized region of a crystalline structure to its melting point and translating this heated region along a length of the structure. As the structure resolidifies and crystallizes, the resulting structure is produced with a single-crystalline structure with a well-defined crystal orientation. Additionally, impurities within the material effectively may be carried with the melting zone to an end of the structure such that repeating the process multiple times may yield a very high purity material.

While the present disclosure generally relates to examples in which the bulk crystal ingot 210 is formed of $LaB_6$ and in which the crystal orientation axis 112 is selected from the <100> family of crystal directions, this is not required of all examples of the methods disclosed herein. For example, it also is within the scope of the present disclosure that the methods disclosed herein also may be utilized with a bulk crystal ingot formed of a material other than $LaB_6$, and/or with a bulk crystal ingot that extends along a direction other than those of the <100> family.

As shown in FIG. 2, the bulk crystal ingot 210 comprises a working portion 214, which represents a region of the bulk crystal ingot 210 that is worked upon, e.g., used, to produce one or more microrods as described herein. In some examples, the working portion 214 is associated with a portion of bulk crystal ingot 210 that has been zone-refined, as discussed above. In the example of FIG. 2, the bulk crystal ingot 210 and the working portion 214 each are substantially cylindrical. In other examples, the bulk crystal ingot may vary in size and/or shape (e.g., along a length thereof), with the working portion representing a portion of the bulk crystal ingot with a substantially consistent shape and/or size.

The working portion 214 may have any suitable dimensions for producing the microrod(s) as disclosed herein. In some examples, and with reference to FIG. 2, the working portion 214 has a working portion diameter 216, as measured along a direction perpendicular to the crystal orientation axis 212, that is about 5 millimeters (mm). Additionally or alternatively, in some examples, the working portion 214 has a working portion height 218, as measured along a direction parallel to the crystal orientation axis 212, that is about 1-2 mm.

Figure 3:
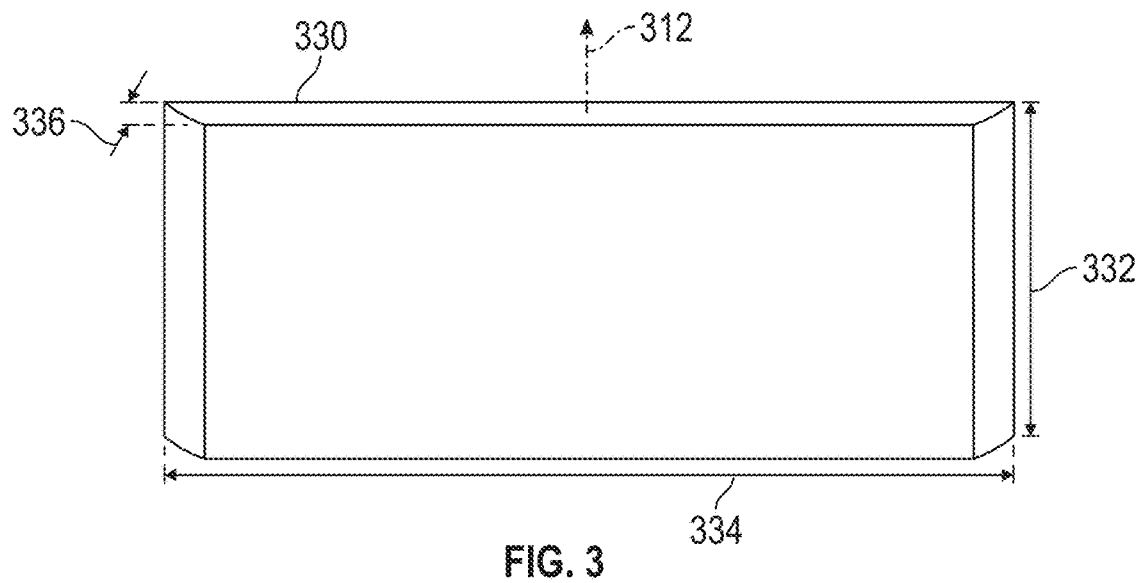
FIG. 3 illustrates a first plate that may be removed from a working portion of a bulk crystal ingot according to an example.

As shown in FIG. 1, the method 100 further comprises producing, at 120, a first plate from the working portion of the bulk crystal ingot. FIG. 2 illustrates the working portion 214 as being partitioned into a plurality of such first plates 230, while FIG. 3 illustrates an example of a first plate 330 in isolation. Specifically, the first plate 330 of FIG. 3 may be described as representing the first plate 230 that is indicated with hatch lines in FIG. 2. As shown in FIGS. 2-3, the producing the first plate at 120 generally is performed such that the first plate 230/330 has a linear dimension (e.g., a length 218) that is aligned with the crystal orientation axis 212/312. Accordingly, further processing the first plate as described below may result in producing each microrod to extend along a well-defined and well-controlled direction relative to the crystal orientation axis.

The producing the first plate at 120 may be performed in any suitable manner. In some examples, the producing the first plate at 120 comprises utilizing an electrical discharge machining (EDM) process to machine the first plate from the working portion. Additionally or alternatively, and as represented in FIG. 2, the producing the first plate at 120 may comprise producing a plurality of first plates 230 from the working portion 214. That is, in such examples, the producing the first plate at 120 may refer to the step of producing any one such first plate, and/or may be repeated to produce each of the plurality of first plates.

In some examples, and with reference to FIG. 2, the producing the first plate at 120 may be performed while the working portion 214 is attached to a remainder of the bulk crystal ingot 210. That is, in such examples, the producing the first plate at 120 may include processing, machining, and/or otherwise manipulating the working portion 214 to isolate, extract, remove, and/or otherwise produce at least one first plate 230 while at least a portion of the working portion 214 remains integral and/or monolithic with a portion of the bulk crystal ingot 210 outside of the working portion 214.

In other examples, the producing the first plate at 120 may be performed with the working portion 214 removed from the remainder of the bulk crystal ingot 210. For example, the method 100 further may comprise, prior to the producing the first plate at 120, removing the working portion from the remainder of the bulk crystal ingot, such as via an EDM process.

Each first plate may have any suitable dimensions, such as may be related to the dimensions of the working portion from which the first plate was removed. For example, and with reference to FIGS. 2-3, the first plate 330 may have a first plate length 332, as measured along a direction parallel to the crystal orientation axis 312, that is substantially equal to the working portion height 218 of the working portion 214. Additionally or alternatively, the first plate length 332 may be about 1-2 mm. Similarly, the first plate 330 may have a first plate width 334, as measured along a direction perpendicular to the crystal orientation axis 312, that is substantially equal to a chord length of the working portion 214 at a location from which the first plate 330 was removed from the working portion 214. Additionally or alternatively, the first plate width 334 may be about 1-4 mm. The first plate width 334 may be measured along a first direction perpendicular to the crystal orientation axis 312 such that the first plate width 334 corresponds to a maximum linear dimension of the first plate 330 along a direction perpendicular to the crystal orientation axis 312.

As further shown in FIG. 3, the first plate 330 also may be characterized by a first plate thickness 336, as measured along a second direction that is perpendicular to each of the first direction corresponding to the first plate width 334 and the crystal orientation axis 312. As an example, the first plate thickness 336 may be about 0.5 mm.

Figure 4:
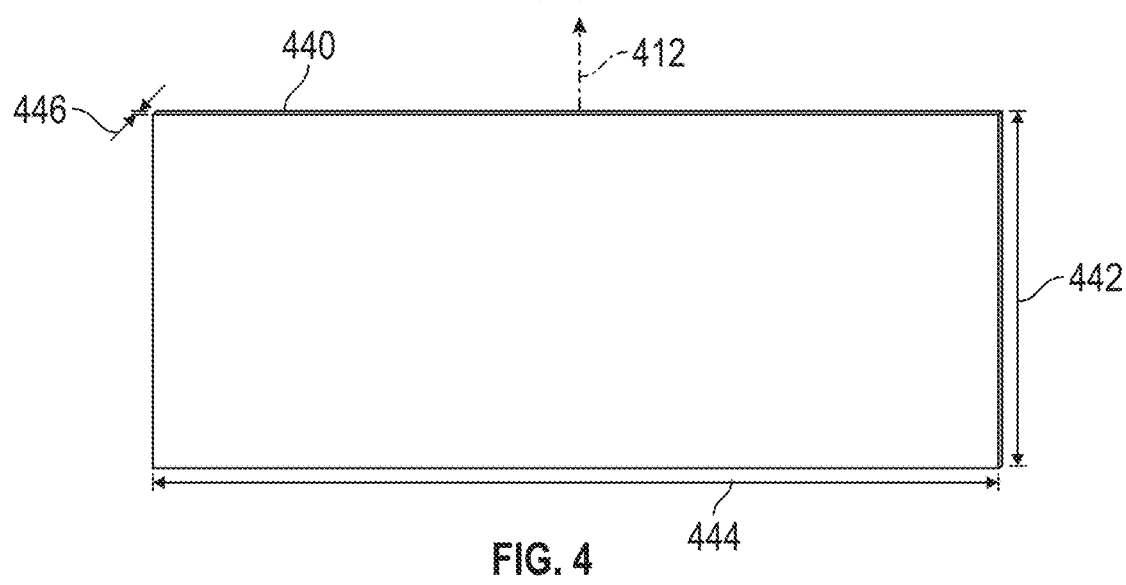
FIG. 4 illustrates a second plate that may be formed from a first plate according to an example.

As shown in FIG. 1, the method 100 further comprises producing, at 130, a second plate from the first plate. FIG. 4 illustrates an example of a second plate 440, such as may be produced from the first plate 330 of FIG. 3.

The producing the second plate at 130 generally corresponds to reducing a thickness of the first plate to a thickness of the microrod(s) produced from the second plate as described below. That is, and with reference to FIG. 4, the producing the second plate at 130 is performed such that the second plate has a second plate thickness 446, as measured along a direction perpendicular to the crystal orientation axis 412 (e.g., the same direction used to measure the first plate thickness 336 of the first plate 330), that is less than the first plate thickness 336 of the corresponding first plate 330. More specifically, in some examples, the second plate thickness 446 is about 50-100 micrometers (μm).

In some examples, the producing the second plate at 130 is performed such that only the thickness of the first plate is reduced. That is, and with reference to FIGS. 3-4, the producing the second plate at 130 may be performed such that the second plate 440 has a second plate length 442, as measured along a direction parallel to the crystal orientation axis 412, that is substantially equal to the first plate length 332 and/or such that the second plate 440 has a second plate width 444, as measured along a direction perpendicular to the crystal orientation axis 412, that is substantially equal to the first plate width 334.

The producing the second plate at 130 may be performed in any suitable manner to reduce the thickness of the first plate. In some examples, the producing the second plate at 130 comprises mechanically grinding and/or polishing the first plate. Producing the second plate via a mechanical grinding operation may be desirable to facilitate controlling the thickness of the second plate and/or the uniformity of the thickness of the second plate to a high degree of precision. Such a mechanical grinding operation also may facilitate producing the second plate with a sub-millimeter thickness with minimal risk of breaking the second plate.

The mechanically grinding the first plate may be performed with any suitable equipment and/or tools. As an example, the grinding may be performed with an abrasive material (e.g., a grinding disc) mounted on a drill press, and the first plate may be supported on a tilting surface mounted under the abrasive material to facilitate control of the planarity of the resulting second plate. In some examples, the mechanically grinding the first plate additionally or alternatively includes using a diamond slurry as an abrasive medium.

This is not required, however, and it additionally is within the scope of the present disclosure that the producing the second plate at 130 may be performed via any suitable method of reducing the thickness of the first plate. Moreover, it also is within the scope of the present disclosure that the method 100 may omit the discrete step of producing the first plate at 120. Specifically, in some examples, the producing the second plate at 130 may include producing the second plate directly from the working portion of the bulk crystal ingot without the intermediate step of producing a thicker first plate.

Figure 5:
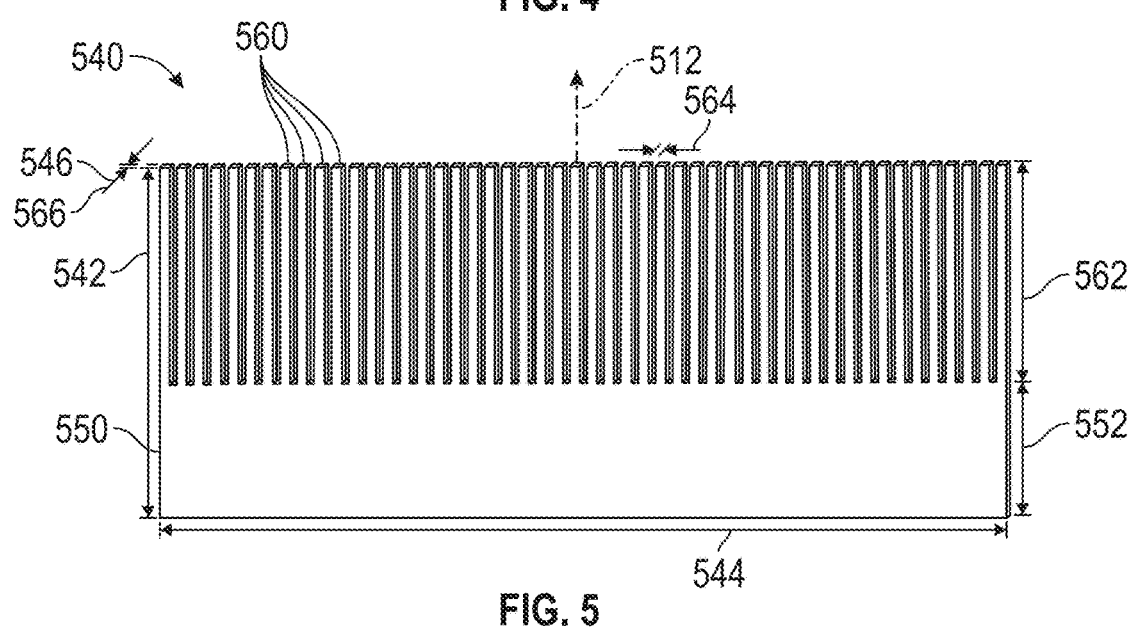
FIG. 5 illustrates a second plate base portion supporting a plurality of microrods according to an example.

As shown in FIG. 1, the method 100 further comprises producing, at 140, one or more microrods from the second plate. FIG. 5 illustrates an example of a second plate 540 that has been operated upon to produce a plurality of microrods 560. In particular, FIG. 5 may be described as representing the second plate 440 of FIG. 4 subsequent to performing the producing the microrod(s) at 140.

As shown in FIG. 5, the producing the microrod(s) at 140 may be performed such that material is removed from the second plate 540 to define each microrod 560 and such that each microrod 560 remains attached to a remainder of the second plate 540. More specifically, and as shown in FIG. 5, the producing the microrod(s) at 140 may be performed such that each microrod 560 extends from and is attached to a second plate base portion 550 of the second plate. That is, in such examples, the second plate base portion 550 may include and/or be the portion of the second plate 540 that does not define any of the microrod(s) 560 and that is not removed to form the microrod(s) 560.

The producing the microrod(s) at 140 may be performed such that each microrod has any suitable dimensions. In some examples, the producing the microrod(s) at 140 comprises producing a plurality of microrods such that each microrod produced from the second plate is substantially identical in size and/or shape.

Additionally or alternatively, and as illustrated in FIG. 5, the producing the microrod(s) at 140 may be performed such that each microrod 560 has a microrod length 562, as measured along a direction parallel to the crystal orientation axis 512, that is about 1-2 mm.

In some examples, the microrod length 562 additionally or alternatively may be characterized with reference to a dimension of the second plate base portion 550. For example, and as illustrated in FIG. 5, the second plate base portion 550 may have a base portion length 552, as measured along a direction parallel to the crystal orientation axis 512, such that the second plate length 542 is equal to the sum of the base portion length 552 and the microrod length 562. The base portion length 552 may represent any suitable proportion of the second plate length 542, such as at least 10% of a second plate length of the second plate, at least 30% of the second plate length, at least 50% of the second plate length, at least 70% of the second plate length, at most 80% of the second plate length, at most 60% of the second plate length, at most 40% of the second plate length, and/or at most 20% of the second plate length.

Additionally or alternatively, the producing the microrod(s) at 140 may be performed such that each microrod 560 has a microrod width 564, as measured along a first direction perpendicular to the crystal orientation axis 512, that is about 50-100 μm. In particular, the first direction perpendicular to the crystal orientation axis 512 may correspond to a direction along which the second plate width 544 of the second plate 540 is measured.

Additionally or alternatively, the producing the microrod(s) at 140 may be performed such that each microrod 560 has a microrod thickness 566, as measured along a second direction perpendicular to each of the first direction and the crystal orientation axis 512, that is about 50-100 μm. In particular, the second direction may correspond to a direction along which the second plate thickness 546 of the second plate 540 is measured. In some examples, and as illustrated in FIG. 5, the microrod thickness 566 is substantially equal to the second plate thickness 546.

The producing the microrod(s) at 140 may be performed in any suitable manner to define the microrod(s) from the second plate. In particular, in some examples, the producing the microrod(s) at 140 is performed by milling the second plate with a laser, according to any of a variety of techniques known to the art. In some examples, the producing the microrod(s) at 140 may comprise milling the second plate with a pulsed laser beam. As more specific examples, the pulsed laser beam may comprise a series of laser pulses each with a duration that is less than 100 nanoseconds (ns), less than 10 ns, less than 1 ns, less than 100 picoseconds (ps), less than 10 ps, less than 1 ps, less than 100 femtoseconds (fs), and/or less than 10 fs.

Using a pulsed laser beam, such as a laser beam with a pulse duration on the order of femtoseconds, may facilitate delivery sufficient energy to the second plate to ablate material from the second plate while minimizing a degree of thermal damage or other residual aberrations in the remaining material. This is not required of all examples, however, and it additionally is within the scope of the present disclosure that the producing the microrod(s) at 140 may comprise milling the second plate with a continuous-wave (CW) laser beam. In some examples, such as an example in which the milling the second plate is performed with a nanosecond laser source, a picosecond laser source, and/or a CW laser source, the producing the microrod(s) at 140 further may comprise processing (e.g., polishing) each microrod to mitigate and/or remove thermal damage to the microrod(s) resulting from the laser.

In examples in which the producing the microrod(s) at 140 includes milling with a laser beam, any suitable laser source may be used to generate the laser beam, examples of which include an infrared laser, a fiber laser, a dye laser, a solid-state laser, and/or an Nd:YAG laser.

The milling the second plate with the laser beam additionally or alternatively may include any of a variety of steps to facilitate and/or automate the milling operation. For example, the milling the second plate with the laser beam may comprise positioning the second plate relative to an alignment indicator, such as a template, a visual indicator, and/or at least a portion of a jig for supporting the second plate. In some examples, the positioning the second plate relative to the alignment indicator may comprise mounting the second plate to such a jig, which may include and/or be any suitable device for supporting the second plate during the laser milling operation.

Additionally or alternatively, in some examples, the milling the second plate with the laser may comprise registering, with a computer device, a position of the second plate, such as a position of the second plate relative to the visual indicator and/or relative to the laser performing the milling. Such a step also may be described as calibrating the laser and/or the computer device for milling the second plate.

Additionally or alternatively, in some examples, the milling the second plate with the laser may comprise executing, with the computer device, an automated laser milling routine. For example, the executing the automated laser milling routine may comprise translating the second plate relative to the laser and/or translating the laser relative to the second plate such that the laser beam emitted by the laser travels along a path suitable to remove material from the second plate to define each microrod.

While the present disclosure generally pertains to examples in which the producing the microrod(s) at 140 comprises milling the second plate with a laser, this is not required. For example, it additionally is within the scope of the present disclosure that the producing the microrod(s) at 140 can comprise removing material from the second plate to define each microrod in any suitable manner, such as via a milling process, an EDM process, a focused ion beam, etc.

In an example in which the producing the microrod(s) at 140 comprises producing such that each microrod is attached to the second plate base portion, the producing the microrod(s) at 140 further may comprise removing each microrod from the second plate base portion. In some examples, this may be performed by mechanically flexing each microrod and/or the second plate base portion relative to one another to snap each microrod off of the second plate base portion. Additionally or alternatively, each microrod may be removed from the second plate base portion at least partially via a milling process, a laser milling process, an EDM process, a focused ion beam, etc.

Figure 6:
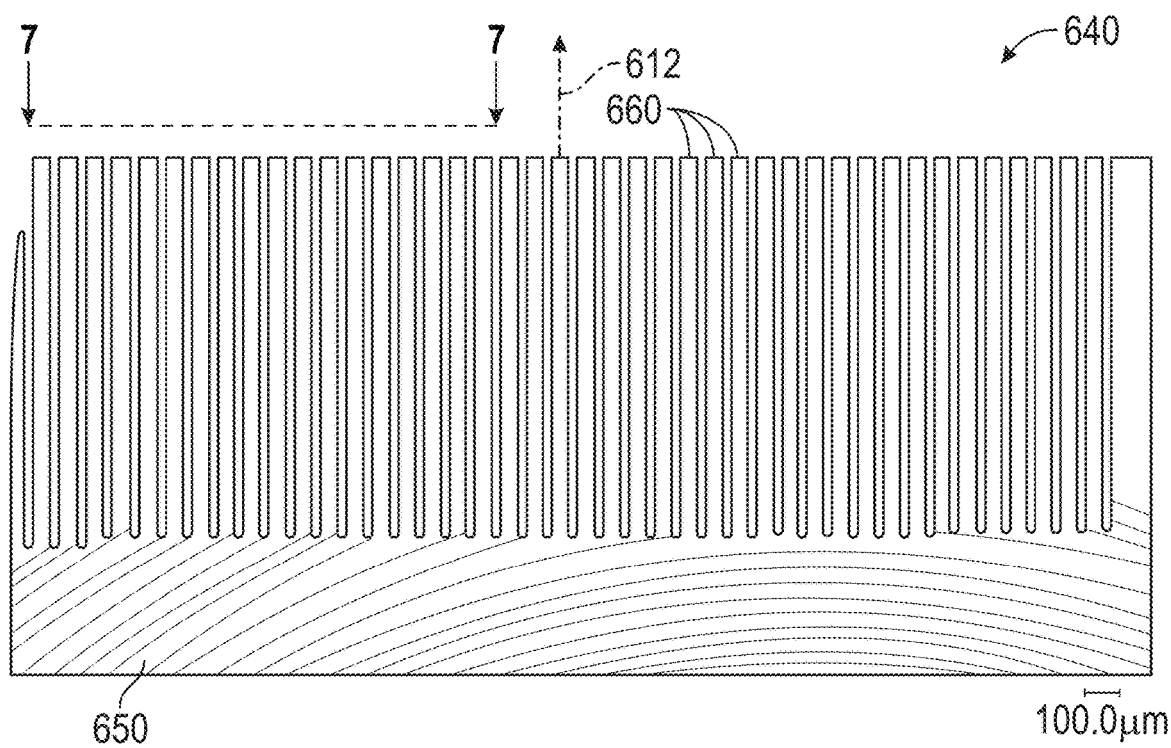
FIG. 6 illustrates a second plate supporting a plurality of microrods according to another example.
Figure 7:
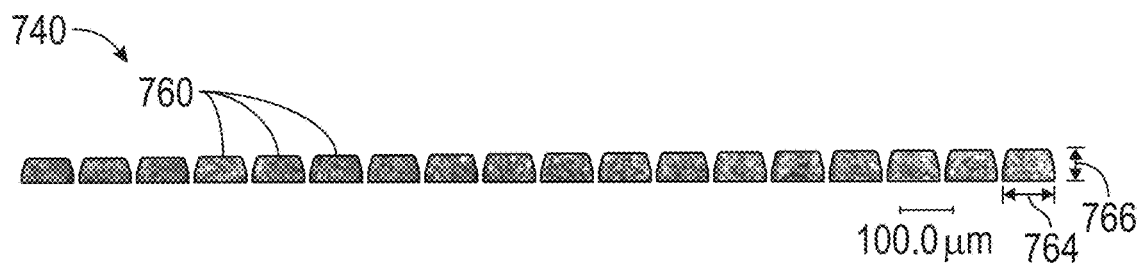
FIG. 7 illustrates the microrods of FIG. 6 as viewed along the line 7-7 of FIG. 6.

FIGS. 6-7 illustrate another example of the second plate subsequent to at least a portion of the producing the microrod(s) at 140. Specifically, FIG. 6 illustrates a second plate 640 with material removed such that the second plate 640 includes a second plate base portion 650 supporting a plurality of microrods 660.

FIG. 7 illustrates the microrods of FIG. 6 as viewed along the line 7-7 of FIG. 6. In other words, FIG. 6 may be described as a side view of the second plate 640, and FIG. 7 may be described as a top view of the plurality of microrods 760. In some examples, and as shown in FIG. 7, milling the second plate with a laser beam to create the plurality of microrods may result in the microrods having a cross-sectional shape (e.g., as viewed along the line 7-7 of FIG. 6) that is substantially trapezoidal and/or otherwise not strictly rectangular. In particular, such a shape may result from and/or correspond to a focused beam profile of the laser beam that is used to mill the second plate, which may vary in beam width within the thickness of the second plate. Such deviations of the cross-sectional shape of the microrods (e.g., away from a perfectly rectangular shape) have been found to represent acceptable artifacts of the fabrication process disclosed herein.

In some examples, and as shown in FIG. 1, the method 100 further comprises producing, at 150, a nanoneedle at a microrod tip region of each microrod. In particular, the nanoneedle comprises a nanorod and a nanoprotrusion tip at a terminal end of the nanorod. In such examples, when the microrod functions as an electron emitter, the electron current is emitted from the nanoprotrusion tip.

As described below, the nanoneedle represents a portion of the microrod that is reduced in one or more dimensions (e.g., width, thickness, and/or diameter) so as to produce a sharp nanoprotrusion tip for emission of electrons. Because the nanoneedle is formed from the microrod, and thus is integrally formed with the microrod, the crystalline structure and/or orientation of the nanorod at the nanoprotrusion tip is the same as that of the microrod. Specifically, the nanoneedle is formed such that the nanoprotrusion tip is directed along and/or toward the crystal orientation axis. State differently, forming a microrod and/or a nanoneedle according to the method 100 may result in each of the microrod, the nanoneedle, and the nanorod extending along a common (e.g., the same) crystal orientation axis.

Figure 8:
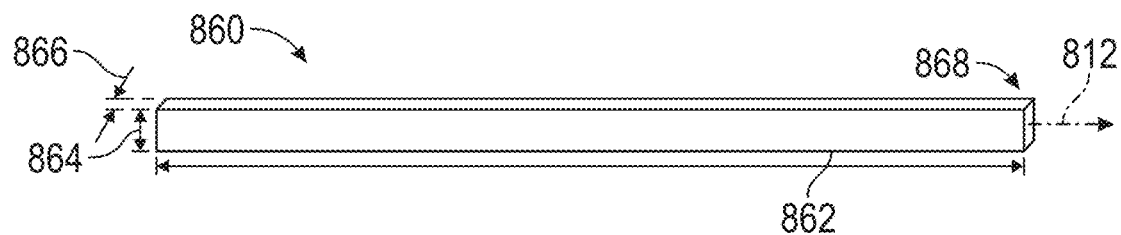
FIG. 8 illustrates a microrod according to an example.
Figure 9:
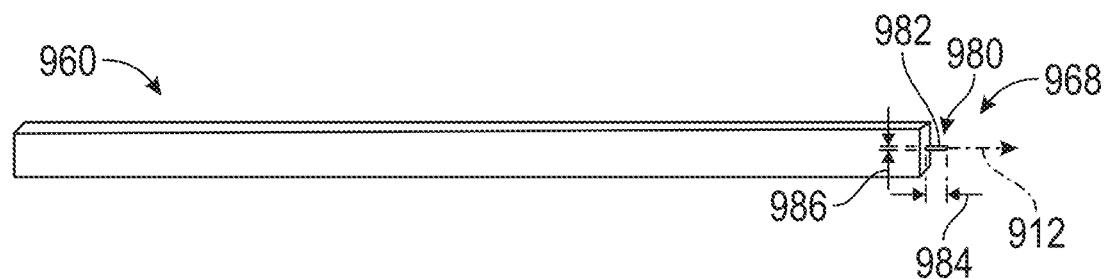
FIG. 9 illustrates a microrod with a microrod tip region that has been coarse processed into a nanorod according to an example.
Figure 10:
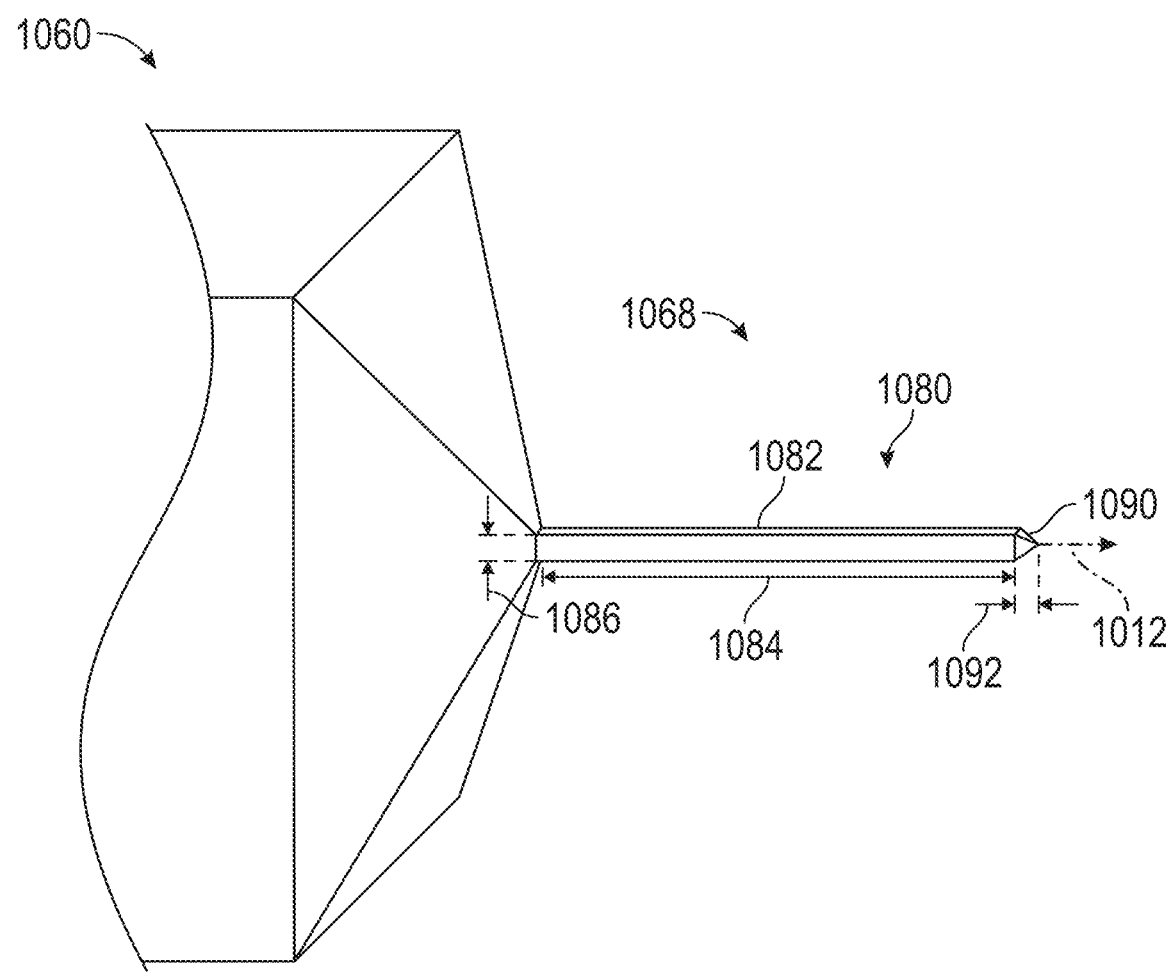
FIG. 10 illustrates a microrod with a nanorod that has been fine processed into a nanoprotrusion tip according to an example.

FIG. 8 illustrates an example of a microrod 860 in isolation, while FIGS. 9-10 illustrate microrods 960 and 1060, respectively, representing various steps of the producing the nanoneedle at 150 as described below. The microrod 860 of FIG. 8 may represent any of the microrods 560 of FIG. 5 subsequent to removing the microrod from the second plate base portion 550 of FIG. 5.

As shown in FIG. 8, the microrod 860 comprises and terminates at a microrod tip region 868 that is worked upon to produce the nanoneedle. In particular, the producing the nanoneedle at 150 may comprise coarse processing the microrod tip portion to produce a nanorod and subsequently fine processing the nanorod to produce the nanoprotrusion tip at a terminal end of the nanorod. FIG. 9 may be described as illustrating the microrod 860 of FIG. 8 subsequent to the coarse processing step, which produces a nanorod 982 of a nanoneedle 980. FIG. 10 may be described as illustrating the microrod 960 and the nanoneedle 980 of FIG. 9 subsequent to the fine processing step, which produces a nanoprotrusion tip 1090 at the terminal end of the nanorod 1082.

The coarse processing the microrod tip portion to produce the nanorod may be performed in any of a variety of manners. In some examples, the coarse processing the microrod tip portion comprises electrochemically etching the microrod tip portion to remove material from the microrod tip portion, thus defining the nanorod with a decreased dimension (e.g., width, thickness, and/or diameter) relative to the microrod. In such examples, the electrochemical etching may be performed according to any of a variety of known techniques.

Additionally or alternatively, the coarse processing the microrod tip portion may comprise milling the microrod tip portion with a directed energy source, such as a focused ion beam. While such a process may offer a finer degree of control of the resultant shape and/or size of the nanoneedle, focused ion beam milling also may require significantly longer processing time than coarse processing via electrochemical etching.

The coarse processing the microrod tip portion may result in a nanorod having any of a variety of dimensions and/or shapes. For example, with reference to FIG. 9, the nanorod 982 may have a nanorod length 984, as measured along a direction parallel to the crystal orientation axis 912, that is about 1-2 µm and/or a nanorod diameter 986, as measured along a direction perpendicular to the crystal orientation axis 912, that is less than about 200 nanometers (nm).

Additionally or alternatively, the nanorod 982 may be characterized by an aspect ratio thereof, defined as the ratio of the nanorod length 984 to the nanorod diameter 986. In particular, the nanorod 982 may have an aspect ratio that is at least 2:1, at least 3:1, at least 5:1, at least 10:1, and/or at least 20:1. In various examples, configuring the nanorod to have a high aspect ratio (e.g., greater than 2:1) may facilitate stable electron emission from the nanoprotrusion tip in a tightly focused beam.

In the example of FIGS. 9-10, the nanorod 982/1082 has the shape of an elongated rectangular prism with flat sides and a substantially constant nanorod diameter 986/1086. This is not required of all examples, however, and it additionally is within the scope of the present disclosure that the nanorod may have any of a variety of shapes, such as may result from the coarse processing step. For example, the nanorod may be substantially cylindrical, may have rounded sides, and/or may have a nanorod diameter that varies along a length of the nanorod.

As discussed above, FIG. 10 may be described as illustrating the nanorod 982 of FIG. 9 subsequent to the step of fine processing the nanorod to produce the nanoprotrusion tip 1090. The fine processing the nanorod may result in the nanoprotrusion tip having any of a variety of dimensions and/or shapes. In this manner, FIG. 10 may be described as showing a magnified view of the microrod tip region 968 of the microrod 960 of FIG. 9. Alternatively, FIG. 10 may be described as illustrating the microrod tip region 1068 of a different microrod 1060.

With reference to FIG. 10, the nanoprotrusion tip 1090 may have a tip length 1092, as measured along a direction parallel to the crystal alignment axis 1012, that is about 1-5 µm. Additionally or alternatively, the nanoprotrusion tip may be characterized by aspect ratio thereof, which may be defined as a ratio of a length of the tip length to a diameter of the nanoprotrusion tip (e.g., an average diameter of the nanoprotrusion tip, a maximum diameter of the nanoprotrusion tip, and/or the nanorod diameter). In particular, the nanoprotrusion tip may have an aspect ratio that is at least 1.25:1, at least 1.5:1, at least 2:1, at least 3:1, at most 5:1, at most 3.5:1, and/or at most 2.5:1.

In the example of FIG. 10, the nanoprotrusion tip 1090 is pyramidal in shape. In particular, in an example in which the fine processing the nanorod comprises focused ion beam milling, the focused ion beam milling may be performed to such that the resulting nanoprotrusion tip is pyramidal in shape. This is not required of all examples, however, and it additionally is within the scope of the present disclosure that the nanoprotrusion tip may have any of a variety of shapes, such as may result from the fine processing step. For example, the nanoprotrusion tip may be rounded, hemispherical, conical, ellipsoidal, etc.

Figure 11:
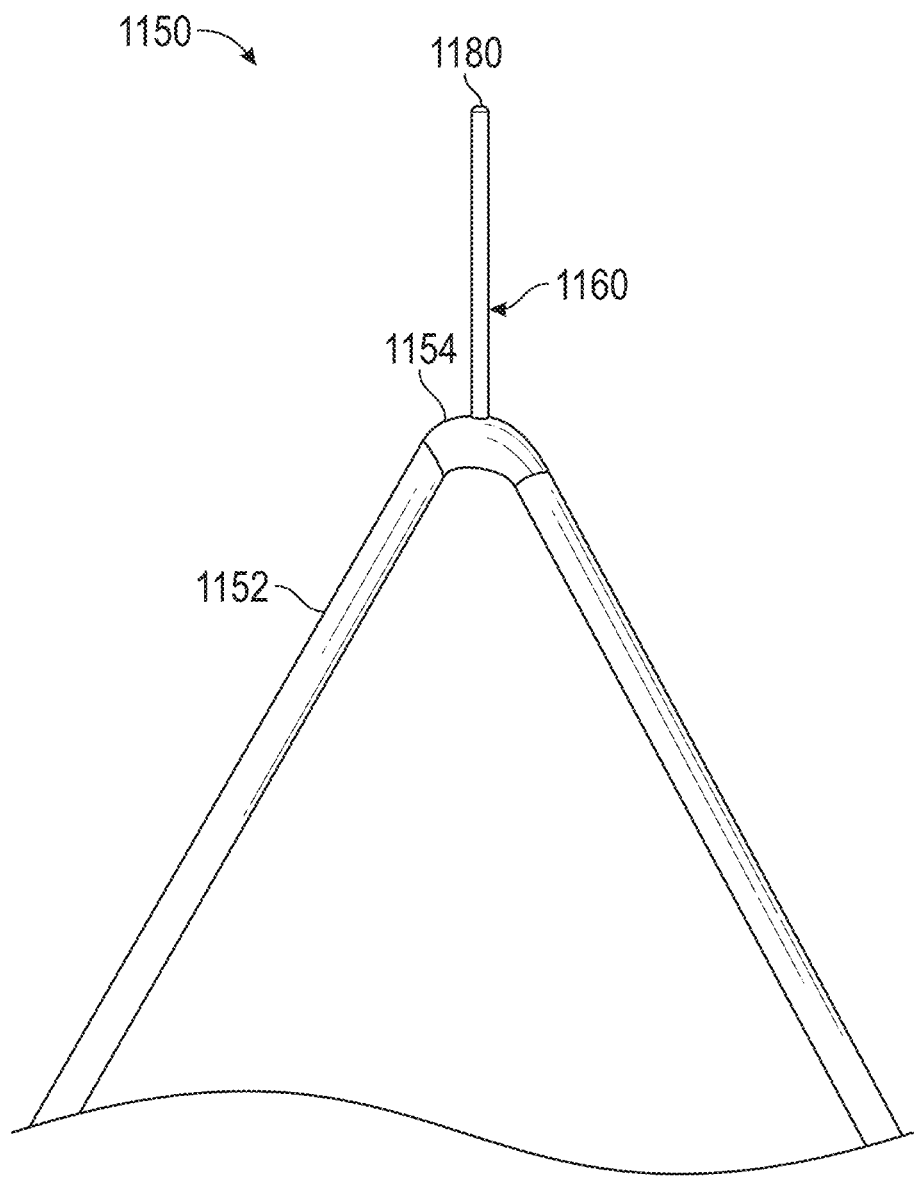
FIG. 11 illustrates an electron emitter comprising a microrod with a nanorod according to an example.

FIG. 11 illustrates an example of an electron emitter 1150 comprising a microrod 1160 with a nanoneedle 1180 according to the present disclosure. For example, the microrod 1160 of FIG. 11 may include and/or be the microrod 1060 of FIG. 10, or a microrod produced according to the method 100 disclosed herein. As illustrated in FIG. 11, the electron emitter 1150 can include a filament 1152 that supports the microrod 1160. In particular, in the example of FIG. 11, the microrod 1160 is attached and/or bonded to the filament 1152 via an adhesive 1154, such as an electrically conductive adhesive and/or a graphite adhesive. Subsequent to bonding the microrod 1160 to the filament 1152, the filament 1152 may be connected to an electrical current source to produce a beam of electrons from the microrod 1160. That is, with the microrod 1160 bonded to the filament 1152, the electron emitter 1150 may be used in a similar manner and/or for a similar purpose as filament-based electron emitters known to the art.

Accordingly, in some examples, and as shown in FIG. 1, the method 100 further comprises assembling, at 160, the electron emitter. In such examples, the assembling the electron emitter at 160 may comprise bonding the microrod to a filament, such as with an electrically conductive adhesive and/or a graphite adhesive.

Thus, various methods are provided for producing microrods and/or electron emitters including the microrods. In contrast with existing techniques for producing a $LaB_6$ electron emitter, the top-down methodologies disclosed herein may be readily scaled to produce a large number of such electron emitters. For example, the providing the bulk crystal ingot at 110 may including acquiring and/or forming the bulk crystal ingot such that the bulk crystal ingot yields a plurality of working portions, such as the working portion 214 illustrated in FIG. 2. In such examples, each of the plurality of working portions may be processed to form a plurality of first plates, which in turn each may be processed to form a plurality of microrods. Additionally, using a laser and/or an automated process to mill the microrods from the second plate may enable the production of a large number of microrods in a short period of time, such as over 30 microrods per hour.

Moreover, various steps of the methods disclosed herein may be performed with significantly relaxed practical constraints relative to prior methods. For example, whereas a prior method may require working under ultrahigh vacuum (UHV) conditions to select, manipulate, and mount a grown microrod, various steps of the method 100 may be performed in air. In particular, steps such as the producing the first plate at 120, the producing the second plate at 130, and/or the producing the nanoneedle at 150 (and/or substeps thereof) may be performed in atmosphere. Additionally or alternatively, in an example in which the providing the bulk crystal ingot at 110 comprises forming the bulk crystal ingot (e.g., via a zone-melting recrystallization method), this step may be performed in atmosphere. In various examples, the milling the second plate with the laser during the producing the microrod(s) at 140 may be performed under vacuum conditions; however, in other examples, this step too may be performed in atmosphere. Additionally, because the nanoneedles are formed from, and hence are monolithic with, the corresponding microrods, the microrods and nanoneedles may be viewed and manipulated with conventional equipment such as optical microscopes, thus obviating the high-resolution microscopy and high-precision manipulators needed to attach a nanoneedle to a separate microrod or emitter.

Figure 12:
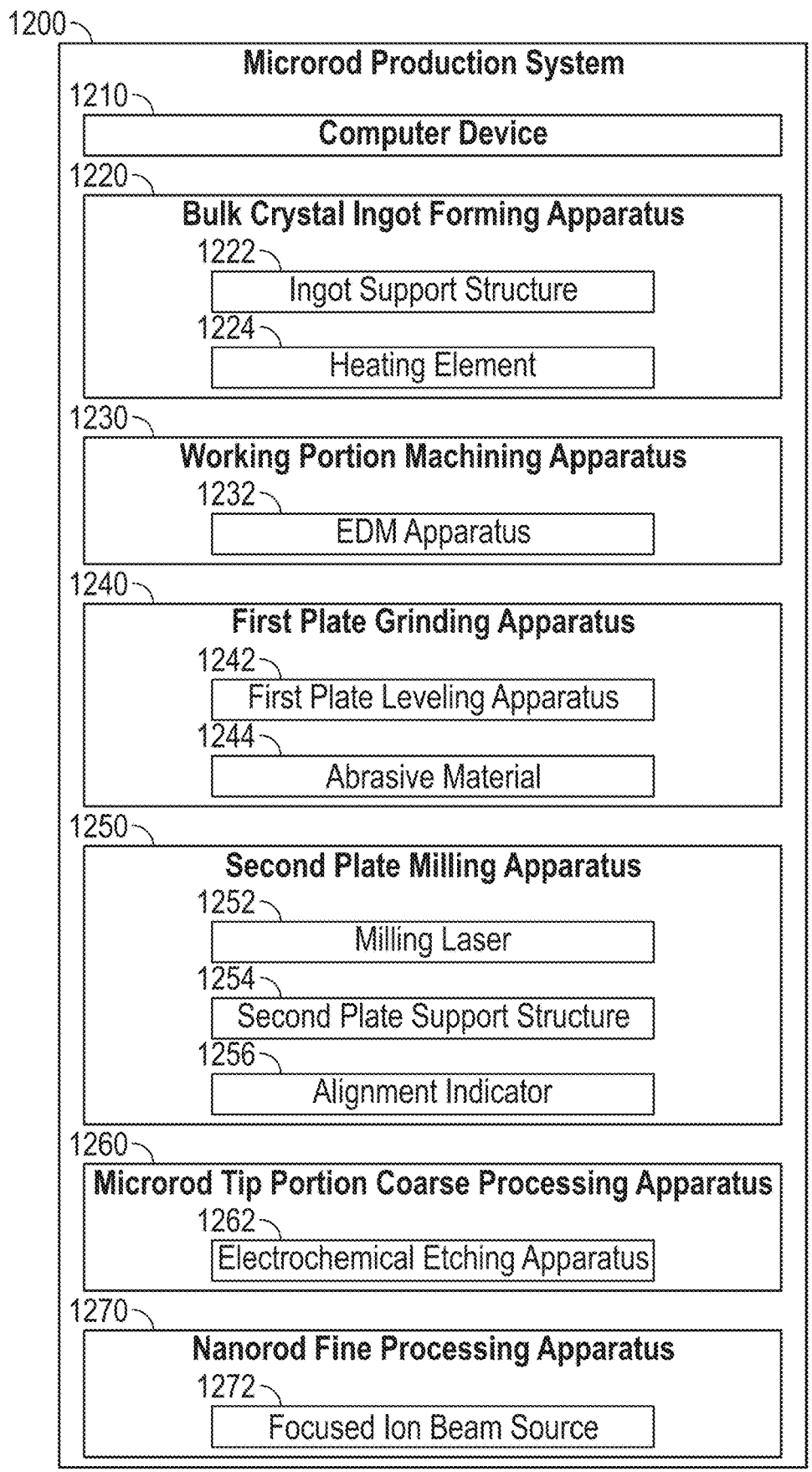
FIG. 12 is a block diagram illustrating a microrod production system that may be used to produce a microrod according to an example.
Figure 13:
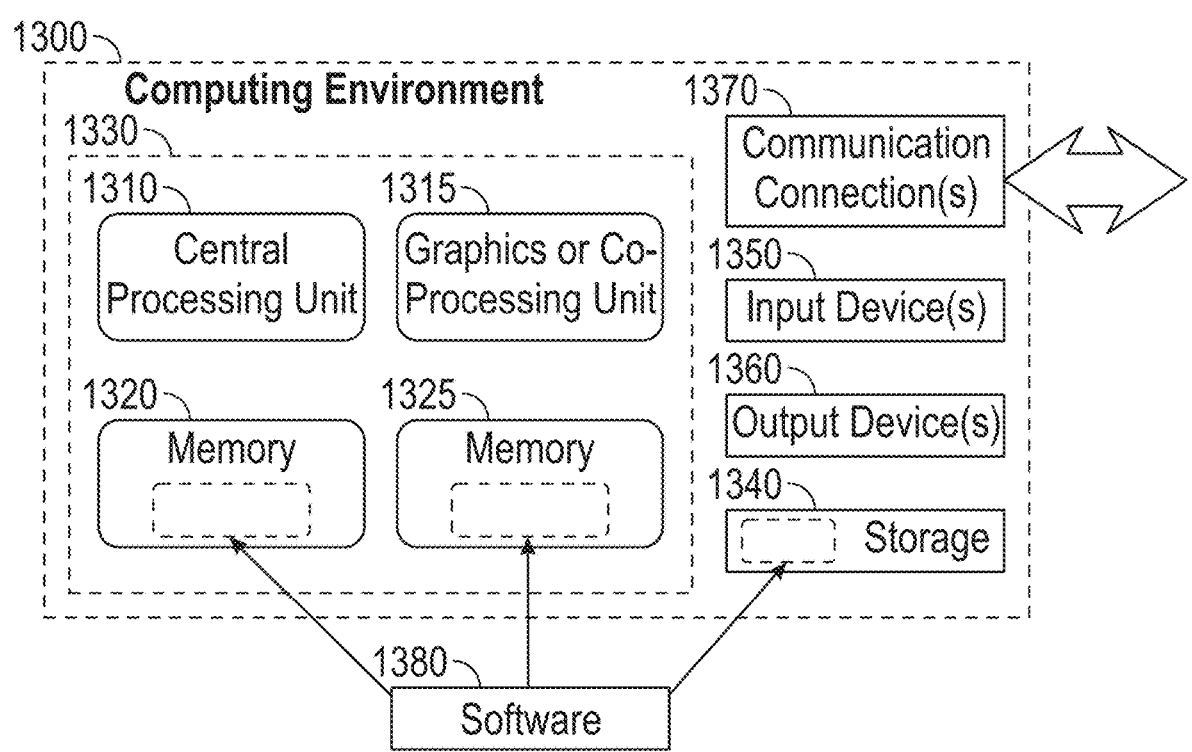
FIG. 13 is a block diagram illustrating an example computing system that may be used to perform portions of the methods described herein.

FIGS. 12-13 schematically illustrate examples of systems and apparatuses that may be used in conjunction with, and/or in the performance of, the method 100 disclosed herein.

FIG. 12 represents an example of a microrod production system 1200 with various apparatuses that may be used to perform various aspects of the method 100. For example, the microrod production system 1200 may include a computer device 1210 that may be used to perform and/or control various aspects of the producing the microrod(s) at 130, such as milling the second plate with the laser beam as described above. As more specific examples, the computer device 1210 may be used to register the position of the second plate relative to the visual indicator and/or to translate the laser and/or the second plate relative to one another.

As shown in FIG. 12, the microrod production system 1200 additionally or alternatively may include a bulk crystal ingot forming apparatus 1220. For example, and as discussed above, the providing the bulk crystal ingot at 110 may include forming the bulk crystal ingot via a zone-melting recrystallization process. In such examples, the bulk crystal ingot forming apparatus 1220 may include an ingot support structure 1222 for supporting at least a portion of the bulk crystal ingot. The bulk crystal ingot forming apparatus also may include a heating element 1224 that may be translated relative to the bulk crystal ingot and/or relative to the ingot support structure 1222 to selectively melt a region of the bulk crystal ingot.

As shown in FIG. 12, the microrod production system 1200 additionally or alternatively may include a working portion machining apparatus 1230. The working portion machining apparatus 1230 may be configured and/or used to perform any suitable portion of the producing the first plate from the working portion at 120. For example, the working portion machining apparatus 1230 may include an EDM apparatus 1232 that is used to mill the first plate from the working portion via an EDM milling process.

As shown in FIG. 12, the microrod production system 1200 additionally or alternatively may include a first plate grinding apparatus 1240. The first plate grinding apparatus 1240 may be configured and/or used to perform any suitable portion of the producing the second plate from the first plate at 130. For example, the first plate grinding apparatus 1240 may include a first plate leveling apparatus 1242, such as a tilting surface that supports the first plate, and/or an abrasive material 1244, such as a grinding disc and/or a diamond slurry.

As shown in FIG. 12, the microrod production system 1200 additionally or alternatively may include a second plate milling apparatus 1250. The second plate milling apparatus 1250 may be configured and/or used to perform any suitable portion of the producing the microrod(s) at 140. In particular, and as described above, the producing the microrod(s) at 140 may include milling the second plate with a laser beam to define the microrod(s). Accordingly, the second plate milling apparatus 1250 may include a milling laser 1252 that is used to perform the milling operation, a second plate support structure 1254 for supporting the second plate relative to the laser, and/or an alignment indicator 1256. In some examples, the second plate support structure 1254 may include and/or define the alignment indicator 1256. As described above, the second plate milling apparatus 1250 may be used in conjunction with the computer device 1210, such as by using the computer device 1210 to register the location of the alignment indicator 1256 and/or to automatically move the milling laser 1252 relative to the second plate support structure 1254 (and/or vice-versa).

As shown in FIG. 12, the microrod production system 1200 additionally or alternatively may include a microrod tip portion coarse processing apparatus 1260. The microrod tip portion coarse processing apparatus 1260 may be configured and/or used to perform any suitable portion of the producing the nanoneedle at 150. For example, and as discussed above, the producing the nanoneedle at 150 may include coarse processing the microrod tip portion via an electrochemical etching process. Accordingly, the microrod tip portion coarse processing apparatus 1260 may include an electrochemical etching apparatus 1262 that is configured and/or used to perform such an electrochemical etching process.

As shown in FIG. 12, the microrod production system 1200 additionally or alternatively may include a nanorod fine processing apparatus 1270. The nanorod fine processing apparatus 1270 also may be configured and/or used to perform any suitable portion of the producing the nanoneedle at 150. For example, and as discussed above, the producing the nanoneedle at 150 may include fine processing the nanorod to produce the nanoprotrusion tip, such as via focused ion beam milling. Accordingly, the nanorod fine processing apparatus 1270 may include a focused ion beam source 1272 that is configured and/or used to perform such a milling process.

FIG. 13 depicts a generalized example of a suitable computing system 1300 that may be used to perform one or more steps of the methods disclosed herein. The computing system 1300 is not intended to suggest any limitation as to scope of use or functionality of the present disclosure, as the innovations may be implemented in diverse general-purpose or special-purpose computing systems. In some examples, the computing system 1300 may include and/or be the computer device 1210 shown in FIG. 12.

With reference to FIG. 13, the computing system 1300 includes one or more processing units 1310, 1315 and memory 1320, 1325. In FIG. 13, this basic configuration 1330 is included within a dashed line. The processing units 1310, 1315 execute computer-executable instructions, such as for implementing aspects of the method 100 and/or for providing hardware commands (e.g., laser milling commands) as described above. A processing unit can be a general-purpose central processing unit (CPU), a processor in an application-specific integrated circuit (ASIC), or any other type of processor. In a multi-processing system, multiple processing units execute computer-executable instructions to increase processing power. For example, FIG. 13 shows a central processing unit 1310 as well as a graphics processing unit or co-processing unit 1315. The tangible memory 1320, 1325 may be volatile memory (e.g., registers, cache, RAM), non-volatile memory (e.g., ROM, EEPROM, flash memory, etc.), or some combination of the two, accessible by the processing unit(s) 1310, 1315. The memory 1320, 1325 stores software 1380 implementing one or more innovations described herein, in the form of computer-executable instructions suitable for execution by the processing unit(s) 1310, 1315.

A computing system 1300 may have additional features. For example, the computing system 1300 includes storage 1340, one or more input devices 1350, one or more output devices 1360, and one or more communication connections 1370. N interconnection mechanism (not shown) such as a bus, controller, or network interconnects the components of the computing system 1300. Typically, operating system software (not shown) provides an operating environment for other software executing in the computing system 1300, and coordinates activities of the components of the computing system 1300.

The tangible storage 1340 may be removable or non-removable, and includes magnetic disks, magnetic tapes or cassettes, CD-ROMs, DVDs, or any other medium that can be used to store information in a non-transitory way and that can be accessed within the computing system 1300. The storage 1340 stores instructions for the software 1380 implementing one or more innovations described herein.

The input device(s) 1350 may be a touch input device such as a keyboard, mouse, pen, or trackball, a voice input device, a scanning device, or another device that provides input to the computing system 1300. The output device(s) 1360 may be a display, printer, speaker, CD-writer, or another device that provides output from the computing system 1300.

The communication connection(s) 1370 enable communication over a communication medium to another computing entity, such as to a laser control device and/or to a translation stage. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, or other carrier.

In view of the above-described implementations of the disclosed subject matter, this application discloses the additional examples enumerated below. It should be noted that one feature of an example in isolation or more than one feature of the example taken in combination and, optionally, in combination with one or more features of one or more further examples are further examples also falling within the disclosure of this application.

Example 1. A method of producing a microrod for an electron emitter, the method comprising: providing a bulk crystal ingot that extends along a crystal orientation axis; producing a first plate from a working portion of the bulk crystal ingot; producing a second plate from the first plate; and producing one or more microrods from the second plate; wherein the producing the first plate comprises machining the working portion to remove the first plate from the bulk crystal ingot; wherein the producing the second plate comprises reducing a thickness of the first plate; and wherein the producing the one or more microrods comprises milling the second plate to remove material from the second plate and to at least partially define the one or more microrods.

Example 2. The method of any example herein, particularly example 1, wherein the bulk crystal ingot comprises lanthanum hexaboride (LaB6).

Example 3. The method of any example herein, particularly any one of examples 1-2, wherein the bulk crystal ingot comprises a simple cubic crystalline structure.

Example 4. The method of any example herein, particularly any one of examples 1-3, wherein the crystal orientation axis is a direction selected from the <100> family of crystal directions.

Example 5. The method of any example herein, particularly any one of examples 1-4, wherein the electron emitter comprises the microrod and a nanoneedle with a nanoprotrusion tip formed from a microrod tip portion of the microrod.

Example 6. The method of any example herein, particularly any one of examples 1-5, wherein the providing the bulk crystal ingot comprising forming the bulk crystal ingot in atmosphere.

Example 7. The method of any example herein, particularly any one of examples 1-6, wherein the providing the bulk crystal ingot comprises forming the bulk crystal ingot via a zone-melting recrystallization method.

Example 8. The method of any example herein, particularly any one of examples 1-7, wherein one or both of the bulk crystal ingot and the working portion is at least substantially cylindrical.

Example 9. The method of any example herein, particularly any one of examples 1-8, wherein the working portion has a working portion diameter, as measured along a direction perpendicular to the crystal orientation axis, that is about 5 millimeters (mm).

Example 10. The method of any example herein, particularly any one of examples 1-9, wherein the working portion has a working portion height, as measured along a direction parallel to the crystal orientation axis, that is about 1-2 mm.

Example 11. The method of any example herein, particularly any one of examples 1-10, wherein the producing the first plate is performed in atmosphere.

Example 12. The method of any example herein, particularly any one of examples 1-11, wherein the producing the first plate comprises producing such that the first plate has: a first plate length, as measured along a direction parallel to the crystal orientation axis, that is about 1-2 mm; a first plate width, as measured along a first direction perpendicular to the crystal orientation axis, that is about 1-4 mm; and a first plate thickness, as measured along a second direction perpendicular to each of the first direction and the crystal orientation axis, that is about 0.5 mm.

Example 13. The method of any example herein, particularly example 12, wherein the first plate length is substantially equal to a working portion height of the working portion.

Example 14. The method of any example herein, particularly any one of examples 12-13, wherein the first plate width is substantially equal to a chord length of the working portion at a location from which the first plate is removed from the working portion.

Example 15. The method of any example herein, particularly any one of examples 1-14, wherein the producing the first plate comprises utilizing an electrical discharge machining (EDM) process to machine the first plate from the working portion of the bulk crystal ingot.

Example 16. The method of any example herein, particularly any one of examples 1-15, wherein the producing the first plate is performed while the working portion is attached to a remainder of the bulk crystal ingot.

Example 17. The method of any example herein, particularly any one of examples 1-15, further comprising, prior to the producing the first plate, removing the working portion from a remainder of the bulk crystal ingot.

Example 18. The method of any example herein, particularly any one of examples 1-17, wherein the method comprises producing a plurality of first plates from the working portion.

Example 19. The method of any example herein, particularly any one of examples 1-18, further comprising repeating the producing the first plate to produce a plurality of first plates from the working portion.

Example 20. The method of any example herein, particularly any one of examples 1-19, wherein the producing the second plate is performed in atmosphere.

Example 21. The method of any example herein, particularly any one of examples 1-20, wherein the producing the second plate comprises mechanically polishing the first plate to reduce the thickness of the first plate.

Example 22. The method of any example herein, particularly example 21, wherein the mechanically polishing the first plate comprises polishing with a diamond slurry.

Example 23. The method of any example herein, particularly any one of examples 1-22, wherein the producing the second plate comprises producing such that the second plate has: a second plate length, as measured along a direction parallel to the crystal orientation axis, that is substantially equal to a first plate length of the first plate; a second plate width, as measured along a first direction perpendicular to the crystal orientation axis, that is substantially equal to a first plate width of the first plate; and a second plate thickness, as measured along a second direction perpendicular to each of the first direction and the crystal orientation axis, that is less than a first plate thickness of the first plate.

Example 24. The method of any example herein, particularly example 23, wherein the second plate thickness is about 50-100 micrometers (µm).

Example 25. The method of any example herein, particularly any one of examples 1-24, wherein the producing the one or more microrods from the second plate is performed such that the one or more microrods are attached to a second plate base portion of the second plate.

Example 26. The method of any example herein, particularly example 25, wherein the producing the one or more microrods comprises removing material from the second plate to define the second plate base portion and the one or more microrods.

Example 27. The method of any example herein, particularly any one of examples 25-26, wherein the producing the one or more microrods comprises defining the second plate base portion such that the second plate base portion has a base portion length, as measured along a direction parallel to the crystal orientation axis, that is one or more of at least 10% of a second plate length of the second plate, at least 30% of the second plate length, at least 50% of the second plate length, at least 70% of the second plate length, at most 80% of the second plate length, at most 60% of the second plate length, at most 40% of the second plate length, and at most 20% of the second plate length.

Example 28. The method of any example herein, particularly any one of examples 1-27, wherein the producing the one or more microrods comprises producing such that each microrod is substantially identical in shape and size.

Example 29. The method of any example herein, particularly any one of examples 1-28, wherein the producing the one or more microrods comprises producing such that each microrod has one or more of: a microrod length, as measured along a direction parallel to the crystal orientation axis, that is about 1-2 mm; a microrod width, as measured along a first direction perpendicular to the crystal orientation axis, that is about 50-100 µm; and a microrod thickness, as measured along a second direction perpendicular to each of the first direction and the crystal orientation axis, that is about 50-100 µm.

Example 30. The method of any example herein, particularly example 29, wherein the microrod thickness is substantially equal to a second plate thickness of the second plate.

Example 31. The method of any example herein, particularly any one of examples 1-30, wherein the milling the second plate is performed under vacuum.

Example 32. The method of any example herein, particularly any one of examples 1-30, wherein the milling the second plate is performed in atmosphere.

Example 33. The method of any example herein, particularly any one of examples 1-32, wherein the producing the one or more microrods comprises milling the second plate with a laser.

Example 34. The method of any example herein, particularly example 33, wherein the milling the second plate with the laser comprises milling with a pulsed laser beam.

Example 35. The method of any example herein, particularly example 34, wherein the pulsed laser beam comprises a series of laser pulses each with a duration that is one or more of less than 100 nanoseconds (ns), less than 10 ns, less than 1 ns, less than 100 picoseconds (ps), less than 10 ps, less than 1 ps, less than 100 femtoseconds (fs), and less than 10 fs.

Example 36. The method of any example herein, particularly any one of examples 33-35, wherein the milling the second plate with the laser comprises milling with a continuous-wave (CW) laser beam.

Example 37. The method of any example herein, particularly any one of examples 33-36, wherein the milling the second plate with the laser comprises using one or more of an infrared laser, a fiber laser, a dye laser, a solid-state laser, and an Nd:YAG laser.

Example 38. The method of any example herein, particularly any one of examples 33-37, wherein the milling the second plate with laser comprises one or more of: (i) positioning the second plate relative to an alignment indicator; (ii) registering, with a computer device, a position of the second plate; and (iii) executing, with the computer device, an automated laser milling routine.

Example 39. The method of any example herein, particularly example 38, wherein the positioning the second plate relative to the alignment indicator comprises mounting the second plate to a jig for supporting the second plate.

Example 40. The method of any example herein, particularly any one of examples 38-39, wherein the alignment indicator comprises one or more of a template, a visual indicator, and a jig for supporting the second plate.

Example 41. The method of any example herein, particularly any one of examples 38-40, wherein the registering the position of the second plate comprises identifying, with the computer device, a location of one or both of the second plate and the alignment indicator.

Example 42. The method of any example herein, particularly any one of examples 38-41, wherein the executing the automated laser milling routine comprises translating one or both of the second plate and the laser such that a laser beam emitted by the laser removes material from the second plate to define the one or more microrods.

Example 43. The method of any example herein, particularly any one of examples 1-42, wherein the producing the one or more microrods from the second plate is performed such that the one or more microrods are attached to a second plate base portion of the second plate; and wherein the producing the plurality of microrods further comprises removing the one or more microrods from the second plate base portion.

Example 44. The method of any example herein, particularly any one of examples 1-43, wherein the removing the one or more microrods from the second plate base portion comprises flexing one or both of the one or more microrods and the second plate base portion to snap the one or more microrods off of the second plate base portion.

Example 45. The method of any example herein, particularly any one of examples 1-44, wherein the removing the one or more microrods from the second plate base portion comprises severing the one or more microrods from the second plate base portion via one or more of a milling process, an EDM process, and a focused ion beam.

Example 46. The method of any example herein, particularly any one of examples 1-45, wherein each microrod comprises and terminates at a microrod tip region; and wherein the method further comprises processing the microrod tip region of each microrod to produce a nanoneedle that comprises a nanorod and a nanoprotrusion tip.

Example 47. The method of any example herein, particularly example 46, wherein the processing the microrod tip region is at least partially performed in atmosphere.

Example 48. The method of any example herein, particularly any one of examples 46-47, wherein the processing the microrod tip region comprises: coarse processing the microrod tip region to produce the nanorod; and subsequent to the coarse processing the microrod tip region, fine processing the nanorod to produce the nanoprotrusion tip at a terminal end of the nanorod.

Example 49. The method of any example herein, particularly example 48, wherein the coarse processing the microrod tip region comprises electrochemically etching the microrod tip region to form the nanorod.

Example 50. The method of any example herein, particularly any one of examples 48-49, wherein the coarse processing the microrod tip region comprises milling with a focused ion beam.

Example 51. The method of any example herein, particularly any one of examples 46-50, wherein the nanorod has one or both of: a nanorod length, as measured along a direction parallel to the crystal orientation axis, that is about 1-2 µm; and a nanorod diameter, as measured along a direction perpendicular to the crystal orientation axis, that is less than about 200 nanometers (nm).

Example 52. The method of any example herein, particularly any one of examples 46-51, wherein the nanorod has an aspect ratio that is one or more of at least 2:1, at least 3:1, at least 5:1, at least 10:1, and at least 20:1.

Example 53. The method of any example herein, particularly any one of examples 46-52, wherein the nanoprotrusion tip has a tip length, as measured along a direction parallel to the crystal orientation axis, that is about 1-5 µm.

Example 54. The method of any example herein, particularly any one of examples 46-53, wherein the nanoprotrusion tip has an aspect ratio that is one or more of at least 1.25:1, at least 1.5:1, at least 2:1, at least 3:1, at most 5:1, at most 3.5:1, and at most 2.5:1.

Example 55. The method of any example herein, particularly any one of examples 46-54, wherein the nanoprotrusion tip is pyramidal in shape.

Example 56. The method of any example herein, particularly any one of examples 1-55, further comprising assembling the electron emitter.

Example 57. The method of any example herein, particularly example 56, wherein the assembling the electron emitter comprises bonding the microrod to a filament.

Example 58. The method of any example herein, particularly example 57, wherein the bonding the microrod to the filament comprises bonding with one or both of an electrically conductive adhesive and a graphite adhesive.

Example 59. A microrod for an electron emitter, comprising: a microrod tip region that comprises a nanoneedle; wherein the nanoneedle comprises a nanorod and a nanoprotrusion tip; wherein the microrod and the nanoneedle are integrally formed from a bulk crystal ingot by sequentially: (i) removing the microrod from the bulk crystal ingot; (ii) coarse processing the microrod tip region to produce the nanorod; and (iii) fine processing the nanorod to produce the nanoprotrusion tip.

Example 60. The microrod of any example herein, particularly example 59, wherein the microrod comprises lanthanum hexaboride (LaB6).

Example 61. The microrod of any example herein, particularly any one of examples 59-60, wherein each of the microrod, the nanoneedle, and the nanorod extends along a common crystal orientation axis.

Example 62. The microrod of any example herein, particularly example 61, wherein the bulk crystal ingot extends along the crystal orientation axis.

Example 63. The microrod of any example herein, particularly any one of examples 61-62, wherein the microrod has one or more of: a microrod length, as measured along a direction parallel to the crystal orientation axis, that is about 1-2 mm; a microrod width, as measured along a first direction perpendicular to the crystal orientation axis, that is about 50-100 µm; and a microrod thickness, as measured along a second direction perpendicular to each of the first direction and the crystal orientation axis, that is about 50-100 µm.

Example 64. The microrod of any example herein, particularly any one of examples 61-63, wherein the nanorod has one or both of: a nanorod length, as measured along a direction parallel to the crystal orientation axis, that is about 1-2 µm; and a nanorod diameter, as measured along a direction perpendicular to the crystal orientation axis, that is less than about 200 nanometers (nm).

Example 65. The microrod of any example herein, particularly any one of examples 61-64, wherein the nanoprotrusion tip has a tip length, as measured along a direction parallel to the crystal orientation axis, that is about 1-5 µm.

Example 66. The microrod of any example herein, particularly any one of examples 59-65, wherein the nanorod has an aspect ratio that is one or more of at least 2:1, at least 3:1, at least 5:1, at least 10:1, and at least 20:1.

Example 67. The microrod of any example herein, particularly any one of examples 59-66, wherein the nanoprotrusion tip has an aspect ratio that is one or more of at least 1.25:1, at least 1.5:1, at least 2:1, at least 3:1, at most 5:1, at most 3.5:1, and at most 2.5:1.

Example 68. The microrod of any example herein, particularly any one of examples 59-67, wherein the nanoprotrusion tip is pyramidal in shape.

Example 69. The microrod of any example herein, particularly any one of examples 59-68, wherein the microrod is produced according to the method of any one of examples 1-58.

Example 70. An electron emitter, comprising: a filament; and the microrod of any one of examples 59-69 operatively coupled to the filament.

Example 71. The electron emitter of any example herein, particularly example 70, wherein the microrod is bonded to the filament by one or both of an electrically conductive adhesive and a graphite adhesive.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

As used herein, the term "about" means the listed value and any value that is within 10% of the listed value. For example, "about 1 mm" means any value between about 0.9 mm and about 1.1 mm, inclusive.

As used herein, the term "substantially" means the listed value and/or property and any value and/or property that is at least 75% of the listed value and/or property. Equivalently, the term "substantially" means the listed value and/or property and any value and/or property that differs from the listed value and/or property by at most 25%. For example, "at least substantially parallel" refers to directions that are fully parallel, and to directions that diverge by up to 22.5 degrees.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

The innovations can be described in the general context of computer-executable instructions, such as those included in program modules, being executed in a computing system on a target real or virtual processor. Generally, program modules or components include routines, programs, libraries, objects, classes, components, data structures, etc. that perform particular tasks or implement particular abstract data types. The functionality of the program modules may be combined or split between program modules as desired in various embodiments. Computer-executable instructions for program modules may be executed within a local or distributed computing system. In general, a computing system or computing device can be local or distributed, and can include any combination of special-purpose hardware and/or general-purpose hardware with software implementing the functionality described herein.

In various examples described herein, a module (e.g., component or engine) can be "coded" to perform certain operations or provide certain functionality, indicating that computer-executable instructions for the module can be executed to perform such operations, cause such operations to be performed, or to otherwise provide such functionality. Although functionality described with respect to a software component, module, or engine can be carried out as a discrete software unit (e.g., program, function, class method), it need not be implemented as a discrete unit. That is, the functionality can be incorporated into a larger or more general-purpose program, such as one or more lines of code in a larger or general-purpose program.

For the sake of presentation, the detailed description uses terms like "determine" and "use" to describe computer operations in a computing system. These terms are high-level abstractions for operations performed by a computer, and should not be confused with acts performed by a human being. The actual computer operations corresponding to these terms vary depending on implementation.

Described algorithms may be, for example, embodied as software or firmware instructions carried out by a digital computer. For instance, any of the disclosed position calibration and/or automated milling techniques can be performed by one or more a computers or other computing hardware that is part of a microscopy tool. The computers can be computer systems comprising one or more processors (processing devices) and tangible, non-transitory computer-readable media (e.g., one or more optical media discs, volatile memory devices (such as DRAM or SRAM), or nonvolatile memory or storage devices (such as hard drives, NVRAM, and solid-state drives (e.g., Flash drives)). The one or more processors can execute computer-executable instructions stored on one or more of the tangible, non-transitory computer-readable media, and thereby perform any of the disclosed techniques. For instance, software for performing any of the disclosed embodiments can be stored on the one or more volatile, non-transitory computer-readable media as computer-executable instructions, which when executed by the one or more processors, cause the one or more processors to perform any of the disclosed techniques or subsets of techniques.

Having described and illustrated the principles of the disclosed technology with reference to the illustrated embodiments, it will be recognized that the illustrated embodiments can be modified in arrangement and detail without departing from such principles. For instance, elements of the illustrated embodiments shown in software may be implemented in hardware and vice-versa. Also, the technologies from any example can be combined with the technologies described in any one or more of the other examples. It will be appreciated that procedures and functions such as those described with reference to the illustrated examples can be implemented in a single hardware or software module, or separate modules can be provided. The particular arrangements above are provided for convenient illustration, and other arrangements can be used.

In view of the many possible embodiments to which the principles of the disclosed technology may be applied, it should be recognized that the illustrated embodiments are only representative examples and should not be taken as limiting the scope of the disclosure. Alternatives specifically addressed in these sections are merely exemplary and do not constitute all possible alternatives to the embodiments described herein. For instance, various components of systems described herein may be combined in function and use.

The invention claimed is:

1. A method of producing a microrod for an electron emitter, the method comprising:
    providing a bulk crystal ingot that extends along a crystal orientation axis;
    producing a first plate from a working portion of the bulk crystal ingot;
    producing a second plate from the first plate; and
    producing one or more microrods from the second plate;
    wherein the producing the first plate comprises machining the working portion to remove the first plate from the bulk crystal ingot;
    wherein the producing the second plate comprises reducing a thickness of the first plate; and
    wherein the producing the one or more microrods comprises milling the second plate to remove material from the second plate and to at least partially define the one or more microrods.

2. The method of claim 1, wherein the bulk crystal ingot comprises lanthanum hexaboride ($LaB_6$).

3. The method of claim 1, wherein the crystal orientation axis is a direction selected from the <100> family of crystal directions.

4. The method of claim 1, wherein the providing the bulk crystal ingot comprises forming the bulk crystal ingot via a zone-melting recrystallization method.

5. The method of claim 1, wherein the producing the first plate comprises producing such that the first plate has:
    a first plate length, as measured along a direction parallel to the crystal orientation axis, that is about 1-2 mm;
    a first plate width, as measured along a first direction perpendicular to the crystal orientation axis, that is about 1-4 mm; and
    a first plate thickness, as measured along a second direction perpendicular to each of the first direction and the crystal orientation axis, that is about 0.5 mm.

6. The method of claim 1, wherein the producing the first plate comprises utilizing an electrical discharge machining (EDM) process to machine the first plate from the working portion of the bulk crystal ingot.

7. The method of claim 1, wherein the method comprises producing a plurality of first plates from the working portion.

8. The method of claim 1, wherein the reducing the thickness of the first plate comprises mechanically polishing the first plate.

9. The method of claim 1, wherein the producing the second plate comprises producing such that the second plate has:
    a second plate length, as measured along a direction parallel to the crystal orientation axis, that is substantially equal to a first plate length of the first plate;
    a second plate width, as measured along a first direction perpendicular to the crystal orientation axis, that is substantially equal to a first plate width of the first plate; and
    a second plate thickness, as measured along a second direction perpendicular to each of the first direction and the crystal orientation axis, that is about 50-100 micrometers (μm).

10. The method of claim 1, wherein the producing the one or more microrods comprises producing such that each microrod has:
    a microrod length, as measured along a direction parallel to the crystal orientation axis, that is about 1-2 mm;
    a microrod width, as measured along a first direction perpendicular to the crystal orientation axis, that is about 50-100 μm; and
    a microrod thickness, as measured along a second direction perpendicular to each of the first direction and the crystal orientation axis, that is about 50-100 μm.

11. The method of claim 1, wherein the milling the second plate comprises milling with a laser.

12. The method of claim 11, wherein the milling the second plate with laser comprises one or more of:
    (i) positioning the second plate relative to an alignment indicator;
    (ii) registering, with a computer device, a position of the second plate; and
    (iii) executing, with the computer device, an automated laser milling routine.

13. The method of claim 1, wherein the producing the one or more microrods from the second plate is performed such that the one or more microrods are attached to a second plate base portion of the second plate, and wherein the producing the one or more microrods comprises:
    removing material from the second plate to define the second plate base portion and the one or more microrods; and
    removing the one or more microrods from the second plate base portion.

14. The method of claim 1, wherein each microrod comprises and terminates at a microrod tip region; wherein the method further comprises processing the microrod tip region of each microrod to produce a nanoneedle that comprises a nanorod and a nanoprotrusion tip; wherein the processing the microrod tip region comprises:
    coarse processing the microrod tip region to produce the nanorod; and
    subsequent to the coarse processing the microrod tip region, fine processing the nanorod to produce the nanoprotrusion tip at a terminal end of the nanorod;
    wherein the coarse processing the microrod tip region comprises electrochemically etching the microrod tip region to form the nanorod; and
    wherein the coarse processing the microrod tip region comprises milling with a focused ion beam.

15. The method of claim 14, wherein the nanorod has one or both of:
- a nanorod length, as measured along a direction parallel to the crystal orientation axis, that is about 1-2 µm; and
- a nanorod diameter, as measured along a direction perpendicular to the crystal orientation axis, that is less than about 200 nanometers (nm).

16. The method of claim 14, wherein the nanoprotrusion tip has a tip length, as measured along a direction parallel to the crystal orientation axis, that is about 1-5 µm.

17. The method of claim 1, further comprising assembling the electron emitter; and
- wherein the assembling the electron emitter comprises bonding the microrod to a filament with one or both of an electrically conductive adhesive and a graphite adhesive.

18. A microrod for an electron emitter, comprising:
- a microrod tip region that comprises a nanoneedle;
- wherein the nanoneedle comprises a nanorod and a nanoprotrusion tip;
- wherein the microrod and the nanoneedle are integrally formed from a bulk crystal ingot by sequentially:
  - (i) removing the microrod from the bulk crystal ingot;
  - (ii) coarse processing the microrod tip region to produce the nanorod; and
  - (iii) fine processing the nanorod to produce the nanoprotrusion tip;
- wherein the removing the microrod from the bulk crystal ingot comprises:
- producing a first plate from a working portion of the bulk crystal ingot;
- producing a second plate from the first plate; and
- producing one or more microrods from the second plate by milling the second plate to remove material from the second plate and to at least partially define the one or more microrods.

19. The microrod of claim 18, wherein each of the microrod, the nanoneedle, the nanorod, and the bulk crystal ingot extends along a common crystal orientation axis.

20. An electron emitter, comprising:
- a filament; and
- the microrod of claim 18 operatively coupled to the filament.

* * * * *